United States Patent
Kostylev et al.

(10) Patent No.: US 7,525,117 B2
(45) Date of Patent: Apr. 28, 2009

(54) CHALCOGENIDE DEVICES AND MATERIALS HAVING REDUCED GERMANIUM OR TELLURUIM CONTENT

(75) Inventors: Sergey A. Kostylev, Bloomfield Hills, MI (US); Tyler Lowrey, San Jose, CA (US); Guy Wicker, Southfield, MI (US); Wolodymyr Czubatyj, Warren, MI (US)

(73) Assignee: Ovonyx, Inc., Rochester Hills, MI (US)

( * ) Notice: Subject to any disclaimer, the term of this patent is extended or adjusted under 35 U.S.C. 154(b) by 0 days.

(21) Appl. No.: 11/301,211

(22) Filed: Dec. 12, 2005

(65) Prior Publication Data

US 2007/0034851 A1 Feb. 15, 2007

Related U.S. Application Data

(63) Continuation-in-part of application No. 11/200,466, filed on Aug. 9, 2005.

(51) Int. Cl.
*H01L 29/02* (2006.01)
(52) U.S. Cl. .................. 257/2; 257/3; 257/4; 257/5; 438/102
(58) Field of Classification Search .............. 257/1–5; 365/100, 163; 346/135.1; 438/102–103
See application file for complete search history.

(56) References Cited

U.S. PATENT DOCUMENTS

| | | | |
|---|---|---|---|
| 3,271,591 A | 9/1966 | Ovshinsky | |
| 3,530,441 A | 9/1970 | Ovshinsky | |
| 4,499,557 A * | 2/1985 | Holmberg et al. | 365/163 |
| 4,876,667 A * | 10/1989 | Ross et al. | 365/113 |
| 5,166,758 A | 11/1992 | Ovshinsky | |
| 5,221,588 A * | 6/1993 | Morimoto et al. | 430/19 |
| 5,296,716 A | 3/1994 | Ovshinsky | |
| 5,335,219 A * | 8/1994 | Ovshinsky et al. | 369/288 |
| 5,359,205 A * | 10/1994 | Ovshinsky | 257/3 |
| 5,395,735 A * | 3/1995 | Nagata et al. | 430/270.13 |
| 5,536,947 A | 7/1996 | Klersy | |
| 5,543,737 A | 8/1996 | Ovshinsky | |
| 5,596,522 A | 1/1997 | Ovshinsky | |
| 5,687,112 A | 11/1997 | Ovshinsky | |
| 5,694,146 A | 12/1997 | Ovshinsky | |
| 5,757,446 A | 5/1998 | Ovshinsky | |
| 5,825,046 A | 10/1998 | Czubatyj | |
| 5,876,822 A * | 3/1999 | Zhou et al. | 428/64.1 |
| 5,912,839 A | 6/1999 | Ovshinsky | |

(Continued)

*Primary Examiner*—Thanh V. Pham
*Assistant Examiner*—Jami M Valentine
(74) *Attorney, Agent, or Firm*—Kevin L. Bray

(57) ABSTRACT

A chalcogenide material and memory device exhibiting fast operation over an extended range of reset state resistances. Electrical devices containing the chalcogenide materials permit rapid transformations from the reset state to the set state for reset and set states having a high resistance ratio. The devices provide for high resistance contrast of memory states while preserving fast operational speeds. The chalcogenide materials include Ge, Sb and Te where the Ge and/or Te content is lean relative to $Ge_2Sb_2Te_5$. In one embodiment, the concentration of Ge is between 11% and 22%, the concentration of Sb is between 22% and 65%, and the concentration of Te is between 28% and 55%. In a preferred embodiment, the concentration of Ge is between 15% and 18%, the concentration of Sb is between 32% and 35%, and the concentration of Te is between 48% and 51%.

15 Claims, 4 Drawing Sheets

U.S. PATENT DOCUMENTS

| | | |
|---|---|---|
| 6,087,674 A | 7/2000 | Ovshinsky |
| 6,314,014 B1 * | 11/2001 | Lowrey et al. ............. 365/100 |
| 6,671,710 B2 | 12/2003 | Ovshinsky |
| 6,687,153 B2 | 2/2004 | Lowrey |
| 6,714,954 B2 | 3/2004 | Ovshinsky |
| 6,774,387 B2 | 8/2004 | Maimon |
| 6,859,390 B2 | 2/2005 | Pashmakov |

* cited by examiner

Fig. 2 (Annotated)

CHALCOGENIDE DEVICES AND MATERIALS HAVING REDUCED GERMANIUM OR TELLURUIM CONTENT

RELATED APPLICATION INFORMATION

This application is a continuation in part of U.S. patent application Ser. No. 11/200,466, entitled "Chalcogenide Devices Incorporating Chalcogenide Materials having Reduced Germanium or Tellurium Content", filed on Aug. 9, 2005; the disclosure of which is hereby incorporated by reference herein.

FIELD OF INVENTION

This invention pertains to chalcogenide materials having utility in electrical memory or switching devices. More particularly, this invention is concerned with off-tieline chalcogenide alloys in the Ge—Sb—Te family that have a low Ge concentration and/or low Te concentration relative to the widely used $Ge_2Sb_2Te_5$ alloy. Most specifically, this invention relates to electrical chalcogenide materials that exhibit high set speeds from initial states having high resistances.

BACKGROUND OF THE INVENTION

Chalcogenide materials are an emerging class of commercial electronic materials that exhibit switching, memory, logic, and processing functionality. The basic principles of chalcogenide materials were developed by S. R. Ovshinsky in the 1960's and much effort by him and others around the world in the past few decades have led to advancements in the underlying science that governs the structure and properties of chalcogenide materials and an expansion of the range of practical application to which chalcogenide materials can be put.

Early work in chalcogenide devices demonstrated an electrical switching behavior in which switching from a resistive state to a conductive state was induced upon application of a voltage at or above a threshold voltage. Although the threshold voltage is formally a property of the device, the response of the active chalcogenide material to the voltage is the critical factor underlying the magnitude of the threshold voltage. The voltage-induced resistive-to-conductive transformation is the basis of the Ovonic Threshold Switch (OTS) and remains an important practical feature of chalcogenide materials. The OTS provides highly reproducible switching at ultrafast switching speeds for over $10^{13}$ cycles. Basic principles and operational features of the OTS are presented, for example, in U.S. Pat. Nos. 3,271,591; 5,543,737; 5,694,146; and 5,757,446; the disclosures of which are hereby incorporated by reference, as well as in several journal articles including "Reversible Electrical Switching Phenomena in Disordered Structures", Physical Review Letters, vol. 21, p. 1450-1453 (1969) by S. R. Ovshinsky; "Amorphous Semiconductors for Switching, Memory, and Imaging Applications", IEEE Transactions on Electron Devices, vol. ED-20, p. 91-105 (1973) by S. R. Ovshinsky and H. Fritzsche; the disclosures of which are hereby incorporated by reference.

Other important applications of chalcogenide materials include electrical and optical memory devices. One type of chalcogenide memory device utilizes the wide range of resistance values available for the material as the basis of memory operation. Each resistance value corresponds to a distinct structural state of the chalcogenide material and one or more of the states can be selected and used to define operational memory states. Chalcogenide materials exhibit a crystalline state or phase as well as an amorphous state or phase. Different structural states of a chalcogenide material differ with respect to the relative proportions of crystalline and amorphous phase in a given volume or region of chalcogenide material. The range of resistance values is bounded by a set state and a reset state of the chalcogenide material. The set state is a low resistance structural state whose electrical properties are primarily controlled by the crystalline portion of the chalcogenide material and the reset state is a high resistance structural state whose electrical properties are primarily controlled by the amorphous portion of the chalcogenide material.

Each memory state of a chalcogenide memory material corresponds to a distinct resistance value and each memory resistance value signifies unique informational content. Operationally, the chalcogenide material can be programmed into a particular memory state by providing an electric current pulse of appropriate amplitude and duration to transform the chalcogenide material into the structural state having the desired resistance. By controlling the amount of energy provided to a chalcogenide material, it is possible to control the relative proportions of crystalline and amorphous phase regions within a volume of the material and to thereby control the structural (and memory) state of the chalcogenide material.

Each memory state can be programmed by providing the current pulse characteristic of the state and each state can be identified or read in a non-destructive fashion by measuring the resistance. Programming among the different states is fully reversible and the memory devices can be written and read over a virtually unlimited number of cycles to provide robust and reliable operation. The variable resistance memory functionality of chalcogenide materials is currently being exploited in the OUM (Ovonic Universal (or Unified) Memory) devices that are beginning to appear on the market. Basic principles and operation of OUM type devices are presented, for example, in U.S. Pat. Nos. 6,859,390; 6,774,387; 6,687,153; and 6,314,014; the disclosures of which are incorporated by reference herein as well as in several journal articles including "Low Field Amorphous State Resistance and Threshold Voltage Drift in Chalcogenide Materials", published in IEEE Transactions on Electron Devices, vol. 51, p. 714-719 (2004) by Pirovana et al.; and "Morphing Memory" published in IEEE Spectrum, vol. 167, p. 363-364 (2005) by Weiss.

The general behavior (including switching, memory, and accumulation) and chemical compositions of chalcogenide materials have been described, for example, in the following U.S. Pat. Nos. 6,671,710; 6,714,954; 6.087,674; 5,166,758; 5,296,716; 5,536,947; 5,596,522; 5,825,046; 5,687,112; 5,912,839; and 3,530,441, the disclosures of which are hereby incorporated by reference. These references also describe proposed mechanisms that govern the behavior of the chalcogenide materials, including the structural transformations from a crystalline state to an amorphous state (and vice versa) via a series of partially crystalline states that underlie much of the operational characteristics of electrical and optical chalcogenide materials.

Current commercial development of the chalcogenide materials and devices is also oriented toward the fabrication of arrays of devices. Chalcogenide materials offer the promise of high density memory, logic and neural arrays that can operate using either a traditional binary data storage protocol or a non-binary, multilevel protocol. Chalcogenide arrays further offer the prospect of integrating, on a single chip, both memory and processing functionality.

In order to further expand the commercial prospects of chalcogenide phase change memories, it is necessary to devise further improvements in the chemical and physical properties of chalcogenide materials as well as in manufacturing processes. A current issue in terms of the properties of chalcogenide materials is the need to improve the thermal stability of the materials. Data in a chalcogenide material are retained as a structural state of the material, so any tendency of the structural state to transform with temperature represents a potential undesirable mechanism of erasing or losing data. Many chalcogenide memory materials retain their structural states for long periods of time at room temperature, but become susceptible to variations in the structural state upon increasing temperature. In practical terms, this limits the temperature environment in which chalcogenide memory devices can be utilized as well as the temperatures that can be employed in processing or manufacturing. It is desirable to develop new chalcogenide compositions having structural states that are stable over an ever-increasing range of temperatures.

In most currently-envisioned memory applications, chalcogenide materials are operated in a binary mode where the memory states correspond to, or approximately correspond to, the set state and the reset state since these states provide the greatest contrast in resistance and thus facilitate discrimination of the state of the material during read out. In most of the fabrication processes contemplated for commercial production of chalcogenide memory devices, the chalcogenide material is deposited on a substrate; electrical contact layer or other layer. After deposition the chalcogenide material is in an amorphous or otherwise disordered state and is converted to a crystalline state during subsequent processing. In completed, fully fabricated devices, it is sometimes necessary to electrically exercise or "form" the chalcogenide material to ready the device for consistent operation as the active material of a memory element. The formation process includes the step of transforming the as-processed chalcogenide device to the optimum state for product use. In devices that employ the widely used $Ge_2Sb_2Te_5$ alloy, the formation process requires multiple cycles of setting and resetting to achieve a set state resistance that stabilizes to a desirable and reproducible value.

In order to increase the efficiency of manufacturing, it is desirable to develop chalcogenide materials and device structures that can be electrically conditioned for practical operation in the minimum time. In U.S. patent application Ser. No. 11/200,466 (the '466 application), the instant inventors identified a series of new chalcogenide compositions that required little or no formation. The alloys include Ge and a column V element, where the column V element is preferably Sb. In some embodiments, the alloys further included Te. Relative to the widely-used $Ge_2Sb_2Te_5$ composition, the alloys were lean in Ge and/or Te. The alloys of the '466 application may be referred to as "off-tieline" alloys because the compositions of the alloys are located away from the tieline connecting $Sb_2Te_3$ and GeTe on a ternary Ge—Sb—Te phase diagram.

In addition to less stringent post-processing formation requirements, it is further desirable to develop chalcogenide alloys that exhibit fast crystallization speeds over a series of memory states that extend over a wide dynamic range of resistance.

SUMMARY OF THE INVENTION

In one embodiment, the instant invention provides chalcogenide alloy compositions that exhibit favorable formation characteristics along with short crystallization times. In another embodiment, the instant invention provides chalcogenide alloy compositions that exhibit crystallization times that vary only slightly over different structural states whose resistances extend over one or more orders of magnitude. When used in electrical chalcogenide device applications, the instant alloys provide for fast set speeds and/or favorable formation characteristics for a plurality of states that extend over a wide range of resistance. The instant alloys also provide favorable threshold voltages, reset currents, and reset resistances.

The instant alloys generally comprise Ge, Sb, and/or Te where the atomic concentration of Ge is generally in the range from 11%-22%, the atomic concentration of Sb is generally in the range from 22%-65%, and the atomic concentration of Te is generally in the range from 28%-55%. In one embodiment, the instant alloys include an atomic concentration of Ge in the range from 13%-20%, an atomic concentration of Sb in the range from 28%-43%, and an atomic concentration of Te in the range from 43%-55%. In another embodiment, the instant alloys include an atomic concentration of Ge in the range from 15%-18%, an atomic concentration of Sb in the range from 32%-35%, and an atomic concentration of Te in the range from 48%-51%.

The instant invention includes electrical devices containing the instant chalcogenide materials where the devices include a layer of chalcogenide material in electrical communication with two electrical terminals or contacts. The instant invention further includes arrays of such devices. In one embodiment, a device including one of the instant alloys requires a set pulse time of less than 100 ns when the reset resistance is $\leq 200$ k$\Omega$. In another embodiment, a device including one of the instant alloys requires a set pulse time of less than 40 ns when the reset resistance is $\leq 100$ k$\Omega$. In a preferred embodiment, a device including one of the instant alloys requires a set pulse time of less than 20 ns when the reset resistance is $\leq 40$ k$\Omega$. In a preferred embodiment, a device including one of the instant alloys requires a set pulse time of less than 30 ns when the reset resistance is $\leq 60$ k$\Omega$.

DETAILED DESCRIPTION OF THE ILLUSTRATED EMBODIMENTS

Figure 1:
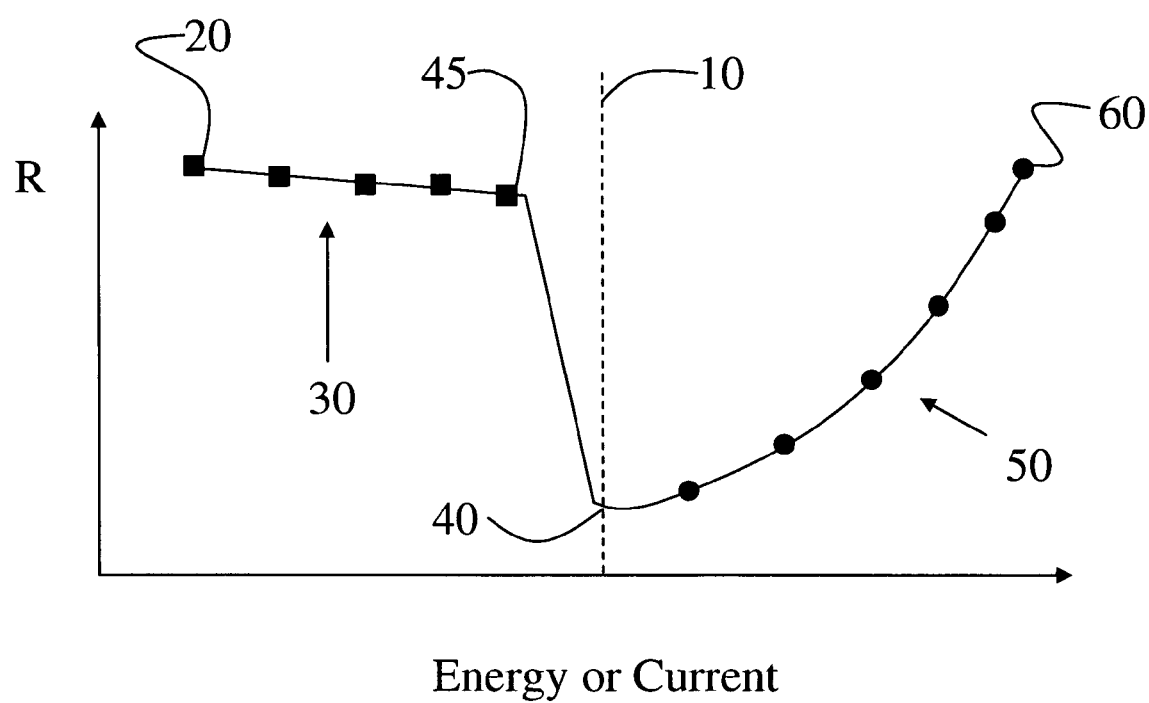
FIG. 1. Schematic depiction of the resistance of a chalcogenide material as a function of energy or current.

The instant invention provides chalcogenide materials and electrical devices containing the instant chalcogenide materials that exhibit favorable operating characteristics for practical memory and switching applications. Devices that include the instant alloys exhibit short set times from reset states having high resistances. The devices provide memory states that span a wide range of resistances where each memory state exhibits a short set time. The devices thus permit rapid transformations between memory states that differ widely in resistance. In particular, devices including the instant chalcogenide alloys enable transformations between a high resistance memory state and a low resistance memory state in which both the speed of the transformation and the ratio of the resistances of the two states is high. The instant devices further provide favorable threshold voltages and reset currents.

The devices also possess favorable forming characteristics similar to those described in the '466 application for similar alloy compositions. In some embodiments, devices that include the instant chalcogenide materials require no forming after fabrication to condition the device for practical application. In these embodiments, the set resistance is stable upon cycling between the set and reset states immediately following deposition of the device and the stabilized set resistance deviates only slightly from the virgin resistance of the device. As a result, the need for post-processing electrical exercise of the devices prior to practical use is greatly reduced. Additional information on the forming process can be found in the '466 application.

Since the underlying basis of the improved set speed characteristics of the instant alloys is related to the structural characteristics of chalcogenide materials, it is helpful to review the basic principles of operation of chalcogenide materials. An important feature of the chalcogenide materials during the operation of chalcogenide memory devices and device arrays is their ability to undergo a phase transformation between or among two or more structural states. (The importance of phase transformations in memory applications has prompted some people to refer to chalcogenide materials as phase change materials and they may be referred to herein as such.) The chalcogenide materials have structural states that include a crystalline state, one or more partially-crystalline states and an amorphous state. The crystalline state may be a single crystalline state or a polycrystalline state. As used herein, a partially-crystalline state refers to a structural state of a volume of chalcogenide material that includes an amorphous portion and a crystalline portion. Generally, a plurality of partially-crystalline states exists for the phase-change material that may be distinguished on the basis of the relative proportion of the amorphous and crystalline portions. Fractional crystallinity is one way to characterize the structural states of a chalcogenide phase-change material. The fractional crystallinity of the crystalline state is 100%, the fractional crystallinity of the amorphous state is 0%, and the partially-crystalline states have fractional crystallinities that vary continuously between 0% (the amorphous limit) and 100% (the crystalline limit). Phase-change chalcogenide materials are thus able to transform among a plurality of structural states that vary inclusively between fractional crystallinities of 0% and 100%.

Transformations among the structural states of a chalcogenide material are induced by providing energy to the chalcogenide material. Energy in various forms can influence the fractional crystallinity of a chalcogenide material and induce structural transformations. Suitable forms of energy include electrical energy, thermal energy, optical energy or other forms of energy (e.g. particle-beam energy) that induce electrical, thermal or optical effects in a chalcogenide material. Combinations of different forms of energy may also induce structural transformations. Continuous and reversible variability of the fractional crystallinity is achievable by controlling the energy environment of a chalcogenide material. A crystalline state can be transformed to a partially-crystalline or an amorphous state, a partially-crystalline state can be transformed to a different partially-crystalline state as well as to either a crystalline or amorphous state, and an amorphous state can be transformed to a partially-crystalline or crystalline state through proper control of the energy environment of a chalcogenide material. Some considerations associated with the use of thermal, electrical and optical energy to induce structural transformations are presented in the following discussion.

The use of thermal energy to induce structural transformations exploits the thermodynamics and kinetics associated with the crystalline to amorphous or amorphous to crystalline phase transitions. An amorphous state may be formed, for example, from any prior state (including a partially-crystalline, crystalline or amorphous state) by heating a chalcogenide material above its melting temperature and cooling at a rate sufficient to inhibit the formation of crystalline phases. A crystalline state may be formed from any prior state (including a partially-crystalline, crystalline or amorphous state), by, for example, heating a chalcogenide material above the crystallization temperature for a sufficient period of time to effect nucleation and/or growth of crystalline domains. The crystallization temperature is below the melting temperature and corresponds to a temperature at which crystallization may occur. The driving force for crystallization is typically thermodynamic in that the free energy of a crystalline or partially-crystalline state is lower than the free energy of an amorphous state so that the overall energy of a chalcogenide material decreases as the fractional crystallinity increases. Formation (nucleation and growth) of a crystalline state or crystalline domains within a partially-crystalline state is kinetically enabled, so that heating below the melting point promotes crystallization by providing energy that facilitates the rearrangements of atoms needed to form a crystalline phase or domain. The fractional crystallinity of a partially-crystalline state can be controlled by controlling the temperature or time of heating of the previously amorphous chalcogenide material or by controlling the temperature or rate of cooling of the previously amorphous chalcogenide material.

The use of electrical energy to induce structural transformations typically relies on the application of electrical (current or voltage) pulses to a chalcogenide material. By controlling the magnitude and/or duration of electrical pulses applied to a chalcogenide material, it is possible to continuously vary the fractional crystallinity. The influence of electrical energy on the structure of a chalcogenide material is frequently depicted in terms of the variation of the low field electrical resistance of a chalcogenide material with the amount of electrical energy provided or the magnitude of the current or voltage pulse applied to a chalcogenide material. A representative depiction of the low field electrical resistance (R) of a chalcogenide material as a function of electrical energy or current pulse magnitude (Energy/Current) is presented in FIG. 1 herein. FIG. 1 shows the variation of the low field electrical resistance of a chalcogenide material resulting from electrical energy or current pulses of various magnitude and may generally be referred to as a resistance plot.

The resistance plot includes two characteristic response regimes of a chalcogenide material to electrical energy. The regimes are approximately demarcated with the vertical dashed line 10 shown in FIG. 1. The regime to the left of the line 10 may be referred to as the accumulating regime of the chalcogenide material. The accumulation regime is distinguished by a nearly constant or gradually varying electrical resistance with increasing electrical energy that culminates in an abrupt decrease in resistance at and beyond a threshold energy. The accumulation regime thus extends, in the direction of increasing energy, from the leftmost point 20 of the resistance plot, through a plateau region (generally depicted by 30) corresponding to the range of points over which the resulting resistance variation is small or gradual up to the set point or state 40 that follows an abrupt decrease in electrical resistance. The plateau 30 may be horizontal or sloping. The left side of the resistance plot is referred to as the accumulating regime because the structural state of the chalcogenide material continuously evolves as energy is applied, with the fractional crystallinity of the structural state correlating with the total accumulation of applied energy. The leftmost point 20 corresponds to the structural state in the accumulating regime having the lowest fractional crystallinity. This state may be fully amorphous or may contain some residual crystalline content. As energy is added, the fractional crystallinity increases, and the chalcogenide material transforms in the direction of increasing applied energy among a plurality of partially-crystalline states along the plateau 30. Selected accumulation states (structural states in the accumulation region) are marked with squares in FIG. 1. Upon accumulation of a threshold amount of applied energy, the fractional crystallinity of the chalcogenide material increases sufficiently to effect a setting transformation that is characterized by a dramatic decrease in electrical resistance and stabilization of the set state 40. Structural transformations in the accumulating regime are unidirectional in the sense that they progress in the direction of increasing applied energy within the plateau region 30 and are reversible only by first amorphizing or resetting chalcogenide material. The behavior illustrated in FIG. 1 is reproducible over many cycles of setting and resetting a device containing a chalcogenide material by applying the requisite energy or current. Once the reset state is obtained, lower amplitude current pulses can again be applied and the accumulation response of the chalcogenide material can be retraced. It is thus possible to cycle between the set and reset states over multiple cycles, a necessary feature for high memory cycle life.

While not wishing to be bound by theory, the instant inventors believe that the addition of energy to a chalcogenide material in the accumulating regime leads to an increase in fractional crystallinity through the nucleation of new crystalline domains or growth of existing crystalline domains or a combination thereof. It is believed that the electrical resistance varies only gradually along the plateau 30 despite the increase in fractional crystallinity because the crystalline domains form or grow in relative isolation of each other so as to prevent the formation of a contiguous crystalline network that spans the chalcogenide material between the two device electrodes. This type of crystallization may be referred to as, sub-percolation crystallization. The setting transformation coincides with a percolation threshold in which a contiguous, interconnected crystalline network forms within the chalcogenide material between the two device electrodes. Such a network may form, for example, when crystalline domains increase sufficiently in size to impinge upon neighboring domains. Since the crystalline phase of chalcogenide materials is less resistive than the amorphous phase, the percolation threshold corresponds to the formation of a contiguous low resistance conductive pathway through the chalcogenide material. As a result, the percolation threshold is marked by a dramatic decrease in the resistance of the chalcogenide material. The leftmost point of the accumulation regime may be an amorphous state or a partially-crystalline state lacking a contiguous crystalline network. Sub-percolation crystallization commences with an initial amorphous or partially-crystalline state and progresses through a plurality of partially-crystalline states having increasingly higher fractional crystallinities until the percolation threshold is reached and the setting transformation occurs.

The regime to the right of the line 10 of FIG. 1 may be referred to as the grayscale regime or grayscale region. The grayscale regime extends from the set state 40 through a plurality of intermediate states (generally depicted by 50) to a reset point or state 60. The various points in the grayscale regime may be referred to as grayscale states of the chalcogenide material. Selected grayscale states are marked with circles in FIG. 1. Structural transformations in the grayscale regime may be induced by applying an electric current or energy pulse to a chalcogenide material, as indicated in FIG. 1. In the grayscale regime, the resistance of the chalcogenide material varies with the magnitude of the applied electric pulse. The resistance of a particular state in the grayscale regime is characteristic of the structural state of the chalcogenide material, and the structural state of a chalcogenide material is dictated by the magnitude of the current pulse applied in the grayscale region. The fractional crystallinity of the chalcogenide material decreases as the magnitude of the current pulse increases. The fractional crystallinity is highest for grayscale states at or near the set point 40 and progressively decreases as the reset state 60 is approached. The chalcogenide material transforms from a structural state possessing a contiguous crystalline network at the set state 40 to a structural state that is amorphous or substantially amorphous or partially-crystalline without a contiguous crystalline network at the reset state 60. The application of current pulses having increasing magnitude has the effect of converting portions of the crystalline network into an amorphous phase and ultimately leads to a disruption or interruption of contiguous high-conductivity crystalline pathways in the chalcogenide material. As a result, the resistance of the chalcogenide material increases as the magnitude of an applied current pulse increases in the grayscale region.

In contrast to the accumulating region, structural transformations that occur in the grayscale region are reversible and bidirectional. For this reason, the grayscale region may also be referred to as the direct overwrite region of the resistance plot. As indicated hereinabove, each state in the grayscale region may be identified by its resistance and a current pulse magnitude, where application of that current pulse magnitude induces changes in fractional crystallinity that produce the particular resistance value of the state. Application of a subsequent current pulse may increase or decrease the fractional crystallinity relative to the fractional crystallinity of the initial state of the chalcogenide material. If the subsequent current pulse has a higher magnitude than the pulse used to establish the initial state, the fractional crystallinity of the chalcogenide material decreases and the structural state is transformed from the initial state in the direction of the higher resistance reset state along the grayscale resistance curve. Similarly, if the subsequent current pulse has a lower magnitude than the pulse used to establish the initial state, the fractional crystallinity of the chalcogenide material increases and the structural state is transformed from the initial state in the direction of the lower resistance set state along the grayscale resistance curve.

In OUM (Ovonic Unified (or Universal) Memory) applications, the grayscale states of the chalcogenide material are used to define memory states of a memory device. Most commonly, the memory devices are binary memory devices that utilize-two of the grayscale states as memory states, where a distinct information value (e.g. "0" or "1") is associated with each state. Each memory state thus corresponds to a distinct structural state of the chalcogenide material and readout or identification of the state can be accomplished by measuring the resistance of the material (or device) since each structural state is characterized by a distinct resistance value as exemplified, for example, by the grayscale states in FIG. 1. The operation of transforming a chalcogenide material to the structural state associated with a particular memory state may be referred to herein as programming the chalcogenide material, writing to the chalcogenide. material or storing information in the chalcogenide material.

To facilitate readout and to minimize readout error, it is desirable to select the memory states of a binary memory device so that the contrast in resistance of the two states is large. Typically the set state (or a state near the set state) and the reset state (or a state near the reset state) are selected as memory states in a binary memory application. The resistance contrast depends on details such as the chemical composition of the chalcogenide, the thickness of the chalcogenide material in the device and the geometry of the device. For a layer of phase-change material having the composition $Ge_{22}Sb_{22}Te_{56}$, a thickness of ~600 Å, and pore diameter of below ~0.1 µm in a typical two-terminal device structure, for example, the resistance of the reset state is ~100-1000 kΩ and the resistance of the set state is under ~10 kΩ. Phase-change materials in general show resistances in the range of ~100 kΩ to ~1000 kΩ in the reset state and resistance of ~0.5 kΩ to ~50 kΩ in the set state. In the preferred phase-change materials, the resistance of the reset state is at least a factor-of two, and more typically an order of magnitude or more, greater than the resistance of the set state. In addition to binary (single bit per device) memory applications, chalcogenide materials may be utilized as non-binary or multiple bit per device memory devices by selecting three or more states from among the grayscale states and associating an information value with each state, where each memory state corresponds to a distinct structural state of the chalcogenide and is characterized by a distinct resistance value.

One embodiment of the instant invention provides chalcogenide materials that enable devices having improved operational speeds, where device speed refers to the time required to induce transformations between structural states. As described hereinabove, the storage of information in a chalcogenide material entails a process in which energy is applied to the chalcogenide material to induce a structural transformation to the memory state that represents the item of information that the user wishes to store. The speed of the device is governed by the rate at which the structural transformations occur and this rate ultimately depends on the kinetics of the transformations between the crystalline and amorphous (or vice versa) states of the chalcogenide material. From a phenomenological viewpoint, structural transformations that induce an increase in fractional crystallinity are expected to be slower than structural transformations that induce a decrease in fractional crystallinity. This expectation follows because the formation of a crystalline phase from an amorphous phase requires the establishment of an ordered phase from a disordered phase and the achievement of an ordered phase necessarily entails an atomic rearrangement that requires significant repositioning of atoms over one or more atomic distances. The time scales required for the necessary atomic motions and reorientation of the atomic bonds in a periodic ordered array is required and the process of crystallization is necessarily an equilibrium process.

A structural transformation that leads to a decrease in fractional crystallinity, in contrast, is an inherently non-equilibrium process that readily occurs on time scales shorter than the equilibrium time scale associated with crystallization of the same material. A decrease in fractional crystallinity involves the transformation of an ordered crystalline region into a disordered amorphous region. The crystalline region is first melted and then quenched to form an amorphous phase. The melting process is not limited by timescales associated with atomic motion of the material and the quenching process generally occurs on a shorter time scale than the crystallization process. The rate of addition of energy to cause melting and the rate of removal of energy to quench the melted state determine the timescale of the transformation. Both rates can be controlled by external experimental conditions and can occur on extremely short time scales. In typical chalcogenide materials, the equilibrium timescale associated with the crystallization process is typically in the 10-1000 nanosecond regime, while the amorphization (melting-quenching) process occurs on sub-nanosecond to 10 nanosecond timescales and can be made to occur on picosecond and even femtosecond timescales by controlling the experimental conditions.

From the above discussion, it follows that the speed of operation of a chalcogenide memory device is determined in part by the rate of transformations from states having a low fractional crystallinity to states having a high fractional crystallinity. In the typical binary device, the two memory states are the reset state (a state having a low fractional crystallinity) and the set state (a state having a high fractional crystallinity) and the speed of operation is expected to be significantly influenced by the timescale of the transformation from the reset state to the set state.

In addition to the rate of the transformation from an amorphous phase to a crystalline phase, the time required to set a chalcogenide device depends on the crystalline volume fraction of the initial state of the device. As described hereinabove in connection with FIG. 1, memory states of a chalcogenide device can be selected from among the grayscale states 50 that extend from the set state 40 to the reset state 60. The set state 40 can be formed from either the reset state 60 or any of the grayscale states 50 by applying and accumulating increments of energy as described hereinabove to achieve a percolation condition. The magnitude of the energy increments required to achieve the percolation needed to set one of the grayscale states is less than the energy needed to induce a transformation from the reset state in the region of 60 of FIG. 1.

Grayscale states that are in close proximity to the set state have a resistance and fractional crystallinity that are similar to that of the set state. These states have a relative low resistance and require a relatively low net accumulation of energy to undergo the setting transformation. The similarity in the fractional crystallinity of low resistance grayscale states to the set state implies a structural configuration or condition for low resistance grayscale scale states that is not far removed from the percolated configuration of the set state. Since only a minor transformation in the structural configuration is needed to achieve the set state, the time required to induce the setting transformation is shorter and more rapid transitions between low resistance grayscale states and the set state are possible.

As the resistance of a grayscale state increases, however, the structural configuration becomes less crystalline and deviates more significantly from the percolated configuration of the set state. A greater accumulation of energy and more substantial transformation of the structural configuration is needed to achieve the set state. The timescale of the setting transformation increases accordingly. This leads to slower operational speeds for memory devices that utilize high resistance grayscale states as memory states.

The foregoing discussion indicates that the intrinsic rate of crystallization of the working chalcogenide material from an amorphous or low fractional crystallinity state and the initial state of crystallinity of the chalcogenide material are two important factors that govern the rate of transformation between memory states and hence, the speed of operation of a memory device. While it is true that fast operational speeds can be achieved by selecting memory states having structural configurations not far removed from the percolated configuration of the set state, this approach is inadequate in many instances. The main drawback arises because in such an approach, the resistance contrast between different memory states is low and-it becomes more difficult to discriminate among the different memory states during read out due to the similarity in the resistances of the different states.

In this invention, a more effective approach to achieving faster operational speeds is realized through chalcogenide compositions that exhibit improved intrinsic rates of crystallizations. The instant chalcogenide alloys enable chalcogenide memory devices that exhibit fast transformations to the set state from grayscale states that extend over a wider range of resistances than is possible with the prior art alloys. The fast intrinsic crystallization rate permits rapid transformations to the set state from high resistance grayscale states because with fast crystallization, the initial deviation of the structural configuration of a grayscale state from the percolated configuration of the set state becomes less important in establishing the speed of transformation. A high crystallization rate can compensate for the increased deviation in structural configurations between a high resistance memory state and the set state. The instant chalcogenide alloys thus enable memory devices that provide both high operational speeds and high resistance contrast between memory states.

While not wishing to be bound by theory, the instant inventors recognize that the process of crystallization in a chalcogenide material can occur through one or more of the following mechanisms: the nucleation of crystalline domains from amorphous domains, growth of such nucleated phases, and the growth of pre-existing crystalline regions. An enhancement in the speed of one or more of these mechanisms is expected to increase the crystallization rate. An enhanced nucleation rate would provide an increase in the concentration of crystalline nuclei and since crystalline nuclei seed the crystallization process, faster crystallization rates would result. Growth is a process in which the size of existing crystalline regions increases through an interfacial conversion of amorphous material to crystalline material at the boundaries of crystalline domains. An enhanced growth rate would promote the expansion of crystalline domains and facilitate the transformation to a percolated structural configuration.

The formation of a crystalline phase from an amorphous phase is generally thermodynamically favored, but kinetically inhibited. At temperatures below the melting point, the free energy of the crystalline phase is lower than the free energy of the amorphous phase and as a result, there is a thermodynamic driving force for crystallization. As indicated above, however, in order to crystallize, it is necessary for the material to undergo the atomic rearrangements necessary to realize an ordered crystalline state. An energy barrier must be surmounted to induce the necessary rearrangements and this energy barrier acts to inhibit crystallization. The nucleation and growth processes are both accompanied by an energy barrier. The kinetic probability of the crystallization process decreases as the magnitude of the energy barrier increases. A possible explanation of the enhanced crystallization rates observed in the instant alloys is a reduction in the energy barrier associated with either or both of the nucleation and growth processes. A reduced energy barrier would occur in chalcogenide compositions that exhibit facile atomic rearrangements at temperatures between the crystallization and melting temperatures. Facile rearrangements would be expected in compositions that have reduced structural rigidity, especially in the amorphous phase.

A possible explanation of the improved crystallization rates may be found in the relative atomic concentrations of the different elements in the instant compositions. The instant materials generally include Ge, Sb, and Te. These elements are tetravalent, trivalent, and divalent; respectively. In many amorphous chalcogenide phases; Te promotes the formation of extended chain structures and Ge and Sb function as modifying elements that act to promote crosslinking between the chains. Ge is a highly crosslinking element, while Sb is only a moderately crosslinking element. Crosslinking acts to increase the rigidity of the amorphous phase structure, so a reduction in Ge and/or Sb concentration may have a tendency to render an amorphous phase less rigid. As the Ge and/or Sb concentration is reduced, however, the Te concentration increases and this has the effect of promoting chain length. Long chain lengths are disadvantageous from a crystallization perspective because long chains are difficult to rearrange to create an ordered state that is conducive to crystallization. The instant chalcogenide materials are generally lean in the atomic concentration of Ge and Te and rich in the atomic concentration of Sb relative to prior art materials. The reduction in Ge suggests a reduced tendency to form crosslinks in the amorphous phase and may act to promote crystallization through a reduction in structural rigidity. A reduction in Te may act to reduce the number and/or length of chain like structures in the amorphous phase and this may promote crystallization by facilitating atomic rearrangements. Although Sb is a crosslinking element, it is less effective at forming crosslinks than Ge. In light of the reduced Te concentration, the influence of the increased Sb concentration on the structural rigidity may not be significant. The instant chalcogenide compositions may thus represent an optimal balance of the factors that underlie the crystallization tendencies of a chalcogenide material.

In one embodiment, the alloy is a material having a Ge concentration in the range from 11%-22%, an Sb concentration in the range from 22%-65%, and a Te concentration in the range from 28%-55%. In another embodiment, the alloy is a material having a Ge concentration in the range from 13%-20%, an Sb concentration in the range from 28%-43%, and a Te concentration in the range from 43%-55%. In one embodiment, the alloy is a material having a Ge concentration in the range from 15%-18%, an Sb concentration in the range from 32%-35%, and a Te concentration in the range from 48%-51%.

Illustrative examples of chalcogenide compositions within the scope of the instant invention and the characteristics of devices that include the instant chalcogenide composition are described in the following examples.

EXAMPLE 1

In this example, the fabrication of memory devices having active chalcogenide layers in accordance with the instant invention is described. The device structure is a commonly utilized two-terminal device design having an active chalcogenide layer in a pore geometry in electrical contact with top and bottom electrodes. Two different device configurations were used and similar results were achieved for each. Both designs were deposited on a Si wafer with a thick $SiO_2$ surface oxide layer.

In one design, a chalcogenide layer having a thickness of 500 Å was deposited on a circular lower electrode of dimension <1000 Å and having surrounding SiO$_2$ layers. A top electrode was next deposited in situ and included a 400 Å carbon layer deposited on top of the chalcogenide layer and one or more conductive layers deposited on top of the carbon layer. The conductive layers typically included a 300 Å TiN layer and a 500 Å Ti layer.

In a second design, a 350 Å bottom electrode layer (e.g. titanium aluminum nitride) was deposited on the surface oxide layer and an insulating layer (e.g. SiO$_2$) was deposited on the bottom electrode. A pore having a diameter of approximately 800 Å was formed in the insulating layer. A chalcogenide layer having a thickness of 500 Å was then deposited. The chalcogenide layer coated the pore and extended laterally over the surrounding insulating layer. A top electrode was next in situ deposited and included a 400 Å carbon layer deposited on top of the chalcogenide layer and one or more conductive layers deposited on top of the carbon layer. The conductive layers typically included a 300 Å TiN layer and a 500 Å Ti layer. Appropriate lithography and patterning was performed on each device design to permit addressing of the devices and the devices were subjected to annealing at 300° C. for 30 minutes. Both device designs are well-known in the art and further information about chalcogenide phase change memory cells can be found in, for example, U.S. Pat. Nos. 5,166,758; 5,296,716; 5,414,271; 5,359,205; and 5,534,712; the disclosures of which are hereby incorporated by reference.

The chalcogenide layer of each memory device of this EXAMPLE was deposited at 200° C. using an RF co-sputtering process. Targets of Ge$_2$Sb$_2$Te$_5$, Ge, and Sb were used in the deposition. By controlling the power, ion energetics, time of exposure and utilization of the different targets in the sputtering process, chalcogenide films of different composition were prepared. Memory devices having chalcogenide layers with the following compositions were fabricated:

| Designation | Chalcogenide Material | Ge (at. %) | Sb (at. %) | Te (at. %) |
|---|---|---|---|---|
| o5133 | Ge$_{22.2}$Sb$_{22.2}$Te$_{55.6}$ | 22.2 | 22.2 | 55.6 |
| o5134 | Ge$_{20.0}$Sb$_{25.5}$Te$_{54.5}$ | 20.0 | 25.5 | 54.5 |
| o5135 | Ge$_{17.8}$Sb$_{33.3}$Te$_{48.9}$ | 17.8 | 33.3 | 48.9 |
| o5136 | Ge$_{15.6}$Sb$_{41.1}$Te$_{43.4}$ | 15.6 | 41.1 | 43.4 |
| o5137 | Ge$_{13.3}$Sb$_{48.8}$Te$_{37.8}$ | 13.3 | 48.8 | 37.8 |
| o5138 | Ge$_{11.1}$Sb$_{56.6}$Te$_{32.3}$ | 11.1 | 56.6 | 32.3 |
| o5142 | Ge$_{25.0}$Sb$_{45.5}$Te$_{29.5}$ | 25.0 | 45.5 | 29.5 |
| o5143 | Ge$_{25.2}$Sb$_{40.7}$Te$_{35.1}$ | 25.2 | 40.7 | 35.1 |
| o5139 | Ge$_{8.9}$Sb$_{64.4}$Te$_{26.7}$ | 8.9 | 64.4 | 26.7 |
| o5140 | Ge$_{6.7}$Sb$_{72.2}$Te$_{21.2}$ | 6.7 | 72.2 | 21.2 |
| o5144 | Ge$_{25.0}$Sb$_{35.5}$Te$_{39.5}$ | 25.0 | 35.5 | 39.5 |
| o5145 | Ge$_{20.0}$Sb$_{60.5}$Te$_{19.5}$ | 20.0 | 60.5 | 19.5 |
| o5146 | Ge$_{31.0}$Sb$_{49.5}$Te$_{19.5}$ | 31.0 | 49.5 | 19.5 |
| o5147 | Ge$_{42.0}$Sb$_{38.5}$Te$_{19.5}$ | 42.0 | 38.5 | 19.5 |

The compositions are listed in atomic percentages of the elements included in the chalcogenide material. The atomic percentages may also be referred to herein as the atomic concentration. Many devices using each of the chalcogenide compositions were fabricated for this example. The chalcogenide materials and devices containing same may be referred to herein by the composition listed above or by the designation shown in the left hand column.

The devices of this example are electrical devices that include a chalcogenide material, a first terminal in electrical communication with the chalcogenide material and a second terminal in electrical communication with the chalcogenide material, where one or more devices utilizing each of the chalcogenide compositions indicated above were fabricated.

The operational characteristics of the devices are qualitatively similar to the behavior depicted in FIG. 1 as each device can be operated among a plurality of reset states (right-side states) or a plurality of accumulation states (left-side states) or a combination of reset and accumulation states. The different chalcogenide compositions lead to differences in the operational characteristics of the devices and such differences are described in EXAMPLE 2 hereinbelow.

EXAMPLE 2

In this example; the improved crystallization speeds of devices that include chalcogenide materials according to the instant invention are described. The device structures utilized in this example correspond to those described in EXAMPLE 1 hereinabove. The crystallization speeds of devices including several of the chalcogenide compositions listed in EXAMPLE 1 hereinabove were measured. In the measurements, a current pulse was applied to the device to transform the chalcogenide to an initial state in the grayscale portion of the response curve. The resistance of the initial state was recorded. In the next step of the experiment, energy was applied to the device and the time required to set the device was recorded. The applied energy was in the form of a current pulse having a constant amplitude and variable width. The energy of the pulse was such that the device operated in the accumulating response regime of the resistance vs. current plot of the device (see FIG. 1). The resistance of the device was monitored as a function of the time of application of the pulse to the device with variable pulse width from 20 ns to 5 µs investigated. The setting transformation was signified by the decrease in resistance described in connection with FIG. 1 hereinabove. The pulse time required to achieve the set state was recorded. For each device, the experiment was repeated by establishing several different initial states in the grayscale regime extending over a wide variety of resistances and the relationship between the resistance of the initial state and the pulse time required to set the device was determined.

Figure 2:
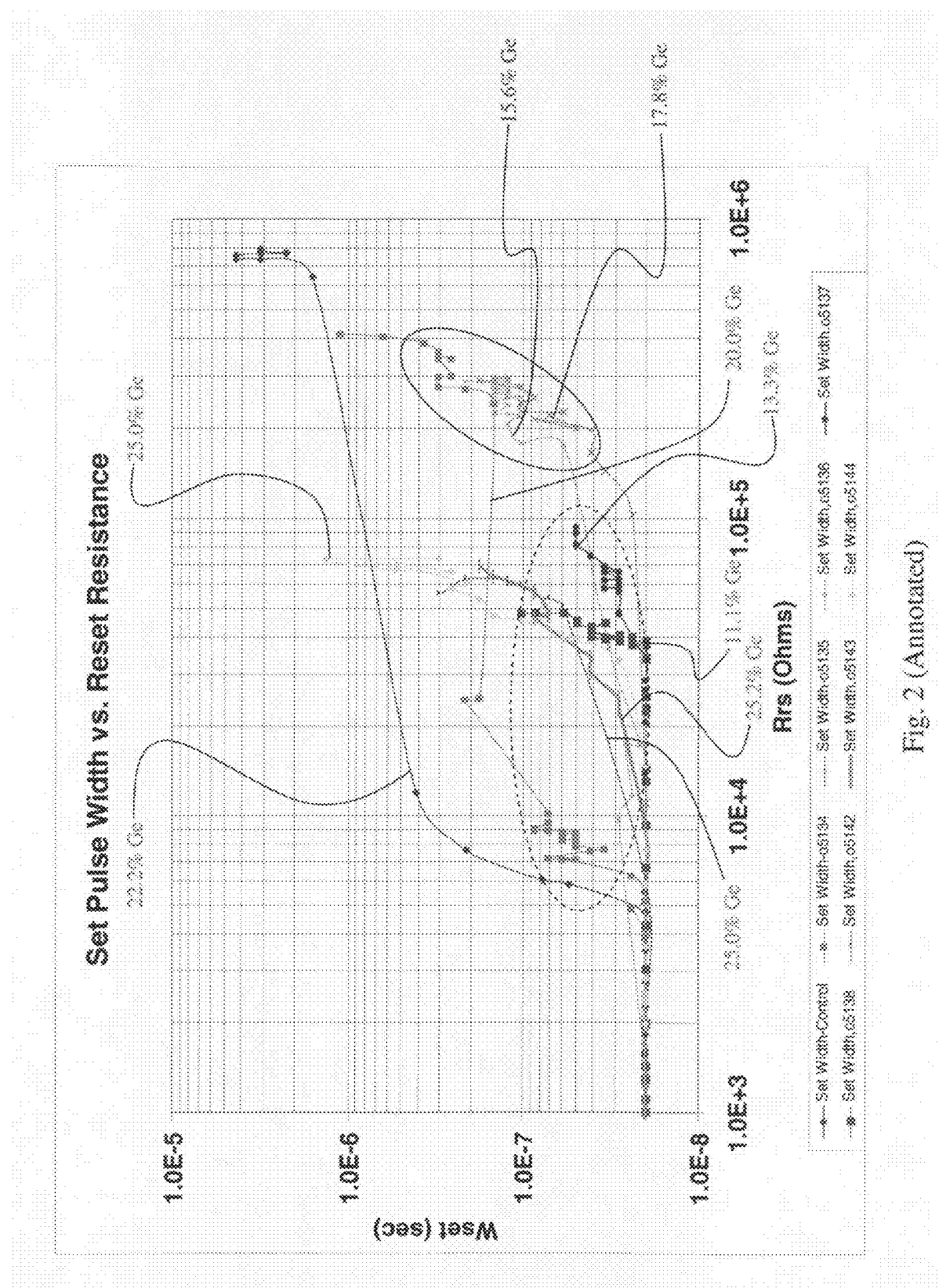
FIG. 2. The variation of set pulse width as a function of reset resistance of several two-terminal electrical devices including different chalcogenide alloys according to the instant invention.

FIG. 2 shows the dependence of the pulse time required to set the device on the resistance of the initial state used in the experiment. The pulse time required to set the device may also be referred to as the set pulse width and is designated as Wset in FIG. 2. The set pulse time is reported in units of seconds. The resistance of the initial state used in the experiment may also be referred to as a reset resistance of the device since it represents the resistance of the grayscale state to which the device was reset prior to initiation of the experiment. (Within the framework of this terminology, the reset state having the maximum resistance may be referred to as the saturated reset state.) The resistance of the initial state is designated as Rrs in FIG. 2 and is reported in units of Ohms. FIG. 2 shows several data curves. Each data curve corresponds to a device that includes a different chalcogenide composition and the points on each curve correspond to different reset states for the device. The legend of FIG. 2 identifies the chalcogenide composition associated with each data curve by its designation in the table of compositions presented hereinabove. The data curve designated as "Control" refers to a device that includes the prior art Ge$_2$Sb$_2$Te$_5$ composition.

The data curve for the control device is typical of the response of prior art chalcogenide materials. When the resistance of the reset state of the control device is below about 4.5 kΩ, the set pulse time is about 20 ns. Above about 4.5 kΩ, however, the set pulse time increases dramatically, reaching a value of about 400 ns at a resistance of about 11.9 kΩ. The results show an approximate twenty-fold difference in set pulse time for memory states that differ in resistance by a factor of slightly greater than two. In practical memory applications, a resistance ratio between memory states of at least a factor of two is desired to permit reliable discrimination of the different states during read out. In the case of the control device, the data show that a significant increase in set pulse time accompanies a two-fold increase in resistance. In terms of operational speed, the longer set pulse time of the higher resistance state is the controlling factor.

A consideration of the data curves for devices that include alloys according to the instant invention show a much more favorable relationship between set pulse time and reset resistance. The data curves of devices including the instant alloys generally fall significantly below the data curve of the control device. Devices that include the instant alloys offer the beneficial characteristic of providing short set pulse times for states having higher reset resistances. Representative data points from selected data curves of FIG. 2 are summarized in the table below:

| Data Curve | Composition | Rrs (kΩ) | Wset (ns) |
|---|---|---|---|
| o5134 | $Ge_{20.0}Sb_{25.5}Te_{54.5}$ | 6.3 | 24 |
| o5134 | $Ge_{20.0}Sb_{25.5}Te_{54.5}$ | 8.3 | 60 |
| o5134 | $Ge_{20.0}Sb_{25.5}Te_{54.5}$ | 245 | 149 |
| o5135 | $Ge_{17.8}Sb_{33.3}Te_{48.9}$ | 11 | 20 |
| o5135 | $Ge_{17.8}Sb_{33.3}Te_{48.9}$ | 103 | 24 |
| o5135 | $Ge_{17.8}Sb_{33.3}Te_{48.9}$ | 252 | 86 |
| o5136 | $Ge_{15.6}Sb_{41.1}Te_{43.4}$ | 9.7 | 29 |
| o5136 | $Ge_{15.6}Sb_{41.1}Te_{43.4}$ | 37 | 33 |
| o5136 | $Ge_{15.6}Sb_{41.1}Te_{43.4}$ | 175 | 60 |
| o5136 | $Ge_{15.6}Sb_{41.1}Te_{43.4}$ | 296 | 124 |
| o5137 | $Ge_{13.3}Sb_{48.8}Te_{37.8}$ | 21 | 20 |
| o5137 | $Ge_{13.3}Sb_{48.8}Te_{37.8}$ | 94 | 50 |
| o5138 | $Ge_{11.1}Sb_{56.6}Te_{32.3}$ | 6.6 | 20 |
| o5138 | $Ge_{11.1}Sb_{56.6}Te_{32.3}$ | 34 | 20 |
| o5138 | $Ge_{11.1}Sb_{56.6}Te_{32.3}$ | 48 | 60 |

The data points illustrate a clear advantage for the instant alloys over the prior art control alloy. Short set pulse times are observed at much higher reset resistances (and over a much wider range or reset resistances) in the devices containing the instant alloys. In the device that included the alloy $Ge_{17.8}Sb_{33.3}Te_{48.9}$, for example, a greater than twenty-fold increase in resistance was accompanied by an increase in set pulse time of a factor of only 4.3. Comparably favorable results are observed for other alloys disclosed herein, including those listed in the table above.

Devices that operate with the instant alloys thus exhibit faster set transformations over a wider range of reset resistances than analogous devices that operate with prior art alloys. From an application standpoint, the extended range of resistances over which fast set transformations are observed is beneficial because it permits the operation of binary devices using memory states widely separated in resistance without sacrificing operational speed. In the case of the control device, for example, a set pulse time of 400 ns permits-operation between memory states separated in resistance by a factor of only slightly greater than two. In the case of a device that includes $Ge_{17.8}Sb_{33.3}Te_{48.9}$, in contrast, a set pulse time of only 86 ns permits operation between memory states separated in resistance by a factor of more than 20. Operating between memory states widely separated in resistance is desirable because such states are more easily distinguished upon reading and more tolerant in cell-to-cell programming variation. A greater resistance contrast reduces read errors.

Devices that include the instant alloys are also advantageous in multistate memory applications. The extended range of resistance states over which fast set transformations occur for the instant alloys means that operation with more memory states becomes possible with less sacrifice of device speed. If, for example, a minimum resistance contrast of about a factor of two is desired to insure sufficiently accurate readability of memory states, only two memory states are available in the control device if one wishes to operate at a rate limited by a set pulse of 400 ns. In the case of the device that includes $Ge_{17.8}Sb_{33.3}Te_{48.9}$ alloy, on the other hand, five memory states, consecutive ones of which exhibit a resistance contrast of a factor of two, can be defined for operation at the faster rate defined by a set pulse time of 86 ns.

The instant invention provides an electrical device that includes a chalcogenide material in electrical communication with at least two terminals, where the device can be operated between a plurality of states determined by the structural characteristics of the chalcogenide material. In one embodiment, the operational states of the device include two or more reset states where the resistance of one of the reset states is greater than the resistance of the other of the reset states by a factor of at least 3 and the required set pulse time of the higher resistance state is greater than the required set pulse time of the lower resistance reset state by a factor of less than 20. In another embodiment, the operational states of the device include two or more reset states where the resistance of one of the reset states is greater than the resistance of the other of the reset states by a factor of at least 3 and the required set pulse time of the higher resistance state is greater than the required set pulse time of the lower resistance reset state by a factor of less than 10. In another embodiment, the operational states of the device include two or more reset states where the resistance of one of the reset states is greater than the resistance of the other of the reset states by a factor of at least 3 and the required set pulse time of the higher resistance state is greater than the required set pulse time of the lower resistance reset state by a factor of less than 5. In another embodiment, the operational states of the device include two or more reset states where the resistance of one of the reset states is greater than the resistance of the other of the reset states by a factor of at least 3 and the required set pulse time of the higher resistance state is greater than the required set pulse time of the lower resistance reset state by a factor of less than 2.

In one embodiment, the operational states of the device include two or more reset states where the resistance of one of the reset states is greater than the resistance of the other of the reset states by a factor of at least 10 and the required set pulse time of the higher resistance state is greater than the required set pulse time of the lower resistance reset state by a factor of less than 20. In another embodiment, the operational states of the device include two or more reset states where the resistance of one of the reset states is greater than the resistance of the other of the reset states by a factor of at least 10 and the required set pulse time of the higher resistance state is greater than the required set pulse time of the lower resistance reset state by a factor of less than 10. In another embodiment, the operational states of the device include two or more reset states where the resistance of one of the reset states is greater than the resistance of the other of the reset states by a factor of at least 10 and the required set pulse time of the higher resistance state is greater than the required set pulse time of the lower resistance reset state by a factor of less than 5.

In one embodiment, the operational states of the device include two or more reset states where the resistance of one of the reset states is greater than the resistance of the other of the reset states by a factor of at least 20 and the required set pulse time of the higher resistance state is greater than the required set pulse time of the lower resistance reset state by a factor of less than 20. In another embodiment, the operational states of the device include two or more reset states where the resistance of one of the reset states is greater than the resistance of the other of the reset states by a factor of at least 20 and the required set pulse time of the higher resistance state is greater than the required set pulse time of the lower resistance reset state by a factor of less than 10. In another embodiment, the operational states of the device include two or more reset states where the resistance of one of the reset states is greater than the resistance of the other of the reset states by a factor of at least 20 and the required set pulse time of the higher resistance state is greater than the required set pulse time of the lower resistance reset state by a factor of less than 5.

Figure 3:
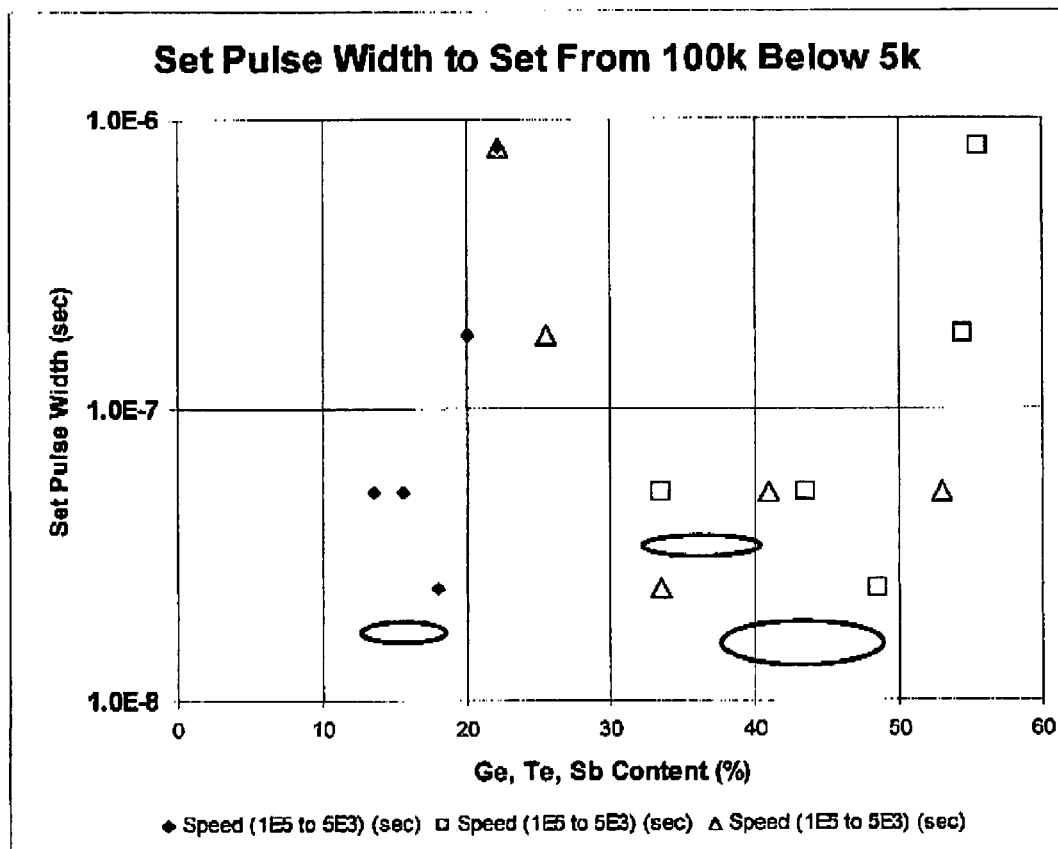
FIG. 3. Set pulse width of a two-terminal electrical device from a reset state having a resistance of above 100 k$\Omega$ to a set state having a resistance below 5 k$\Omega$ as a function of the atomic concentrations of Ge, Sb and Te present in the active chalcogenide material of the device.

FIG. 3 was derived from FIG. 2 and summarizes selected set pulse width data for the control device and devices that include the instant alloys. FIG. 3 specifically shows the set pulse time from a reset state having a resistance above 100 kΩ for devices including the control alloy and several of the instant alloys. The set state in the transformation of each of the devices had a resistance of less than 5 kΩ. In FIG. 3, the set pulse width is plotted as a function of the atomic percentages of Ge, Sb and Te in the active chalcogenide layer of the devices. The atomic percentages of Ge, Sb, and Te are depicted with diamond symbols, triangle symbols, and square symbols, respectively. The atomic percentage of each element is indicated for each of several compositions, so that each composition is represented by three symbols in FIG. 3. Since one set pulse width is reported for each composition in FIG. 3, the three symbols representing each composition are horizontally-aligned. The uppermost set of three symbols correspond to the set pulse width of the control device, which utilizes $Ge_{22}Sb_{22}Te_{55}$ as the active chalcogenide material. This composition exhibits the longest set pulse width displayed in FIG. 3.

Also included in FIG. 3 are three ovals that designate the preferred atomic percentage of each element of the chalcogenide material. The approximate ranges associated with the ovals are based on the desirability of realizing short set pulse widths and fast device operation. The left oval depicts the preferred range of the atomic percentage of Ge and extends from about 13.5% to about 18%. In this range of Ge compositions, the set pulse width of the device is considerably shorter than the set pulse width of the control device (which includes a chalcogenide material having an atomic percentage of Ge of 22%) and of a device that includes $Ge_{20}Sb_{30}Te_{50}$ as the active chalcogenide material.

The middle oval depicts the preferred range of the atomic percentage of Sb and extends from about 33.0% to about 41%. In this range of Sb compositions, the set pulse width of the device is considerably shorter than the set pulse width of the control device (which includes a chalcogenide material having an atomic percentage of Sb of 22%) and of a device that includes $Ge_{20.0}Sb_{25.5}Te_{54.5}$ as the active chalcogenide material.

The right oval depicts the preferred range of the atomic percentage of Te and extends from about 37% to about 48%. In this range of Te compositions, the set pulse width of the device is considerably shorter than the set pulse width of the control device (which includes a chalcogenide material having an atomic percentage of Te of 55%) and of a device that includes $Ge_{20.0}Sb_{25.5}Te_{54.5}$ as the active chalcogenide material.

Figure 4:
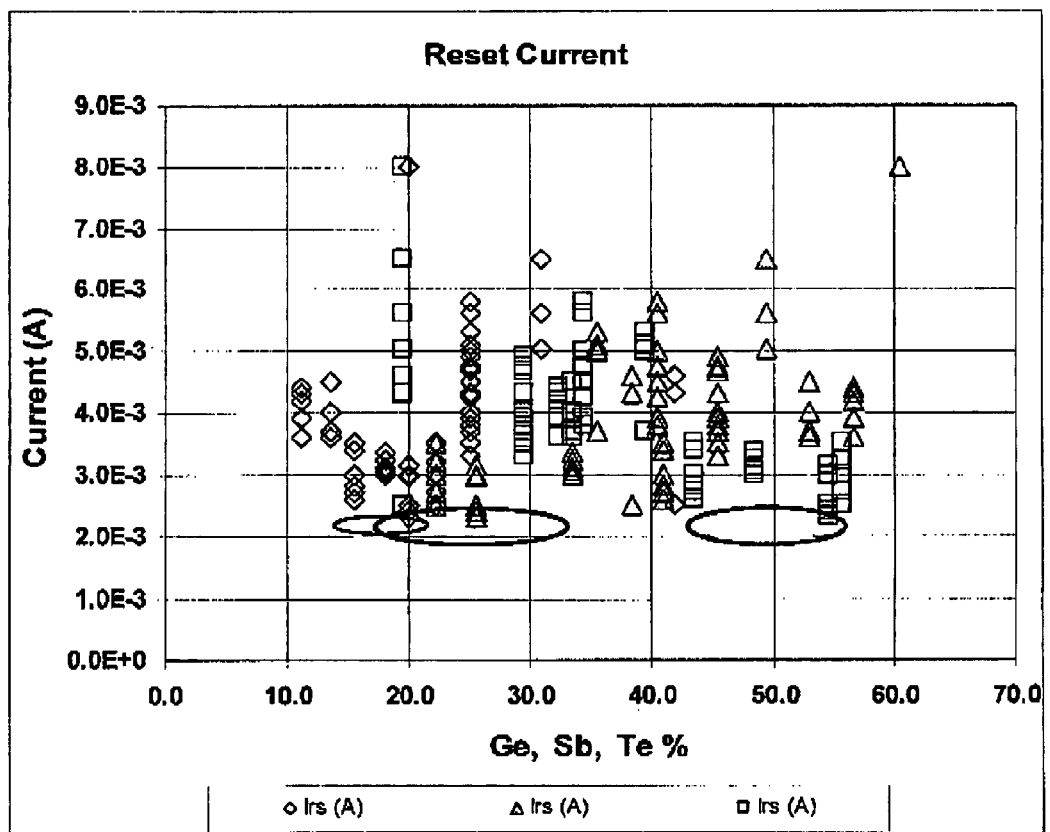
FIG. 4. Reset current of a two-terminal electrical device to a saturated reset state as a function of the atomic concentrations of Ge, Sb and Te present in the active chalcogenide material of the device.

FIG. 4 is also derived from the results presented in FIG. 2 and provides a summary of the required reset current of the devices. The reset current is presented as a function of the atomic percentages of the elements included in the active chalcogenide layer of the devices. As in FIG. 3, the atomic percentage of Ge, Sb, and Te is depicted for each composition and each composition is represented by three horizontally-aligned symbols. The atomic percentages of Ge, Sb, and Te are depicted with diamonds, triangles, and squares, respectively. The reset current is expressed as amperes (A) and corresponds to the current required to transform the device to its saturated reset state. As described hereinabove, the saturated reset state of a device is the reset state having maximum resistance. In order to minimize the power required to operate the device, it is desirable for the device to have a low reset current.

FIG. 4 includes ovals to indicate the preferred range of the atomic percentages of Ge, Sb, and Te. The preferred ranges correspond to atomic percentages of the different elements that lead to lower reset currents. The left oval depicts the preferred range of the atomic percentage of Ge and extends from about 14% to about 22%. In this range of Ge compositions, the reset current of the device is generally reduced relative to compositions having a greater or lesser atomic percentage of Ge. The middle oval depicts the preferred range of the atomic percentage of Sb and extends from about 17% to about 33%. In this range of Sb compositions, the reset current of the device is generally reduced relative to compositions having a greater or lesser atomic percentage of Sb. The right oval depicts the preferred range of the atomic percentage of Te and extends from about 43% to about 55%. In this range of Te compositions, the reset current of the device is generally reduced relative to compositions having a greater or lesser atomic percentage of Te.

In addition to the results described in EXAMPLE 2 hereinabove, further experiments using the devices and compositions described in EXAMPLE 1 hereinabove were completed. These experiments were directed at the measurements of: the set pulse width necessary to transform a device from a reset state having a resistance of 50 kΩ to a set state having a resistance below 5 kΩ; the threshold voltage of the device in its saturated reset state; the holding voltage of the device; and the virgin resistance of the device. The set of parameters included in these experiments and the experiments described in EXAMPLE 2 hereinabove correspond to several of the more important device characteristics for practical memory applications. The result generally indicate a small variation in the optimal range of atomic percentages of Ge, Sb, and Te for the different properties. As a result, in the design of new devices, the significance of the different properties are weighed against each other to achieve an overall optimum level of performance.

The instant invention generally provides chalcogenide materials that include Ge and Sb. In one embodiment, the atomic concentration of Ge is between 11% and 21%. In a preferred embodiment, the atomic concentration of Ge is between 13% and 20%. In another preferred embodiment, the atomic concentration of Ge is between 15% and 18%. In one embodiment, the atomic concentration of Sb is between 22% and 65%. In a preferred embodiment, the atomic concentration of Sb is between 28% and 43%. In another preferred embodiment, the atomic concentration of Sb is between 32% and 35%. In each of the foregoing embodiments, the composition ranges indicated for each of the elements is inclusive of the endpoint compositions.

The instant invention further provides chalcogenide materials that include Ge and Sb in the concentration ranges described above as well as Te. In one embodiment, the atomic concentration of Te is between 28% and 55%. In a preferred embodiment, the atomic concentration of Te is between 43% and 55%. In another preferred embodiment, the atomic concentration of Te is between 48% and 51%. In each of the foregoing embodiments, the composition ranges indicated for each of the elements is inclusive of the endpoint compositions.

The instant invention further includes embodiments having functional equivalents to the illustrative embodiments described hereinabove. As described in several of the U.S. Patents incorporated by reference hereinabove, chalcogenide materials generally include a chalcogen element and one or more chemical or structural modifying elements. The chalcogen element (e.g. Te, Se) is selected from column VI of the periodic table and the modifying elements can be selected from column III (e.g. Ga, Al, In), column IV (e.g. Si, Ge, Sn), or column V (e.g. P, As, Sb) of the periodic table. The role of modifying elements includes providing points of branching or crosslinking between chains comprising the chalcogen element. Column IV modifiers can function as tetracoordinate modifiers that include two coordinate positions within a chalcogenide chain and two coordination positions that permit branching or crosslinking away from the chalcogenide chain. Column III and V modifiers can function as tricoordinate modifiers that include two coordinate positions within a chalcogenide chain and one coordinate position that permits branching or crosslinking away from the chalcogenide chain. Although the embodiments described hereinabove have illustrated the features of the instant invention using chalcogenide materials that include Ge, Sb, and/or Te, it is to be understood by those of skill in the art that Ge may be substituted in whole or in part with another column IV element (e.g. Si), Sb may be substituted in whole or in part with another column V element (e.g. As), and Te may be substituted in whole or in part with another column VI element (e.g. Se).

In addition to individual devices, the instant invention further extends to arrays of devices. The instant chalcogenide materials and devices can be integrated into arrays, including X-Y arrays, such as those described in U.S. Pat. Nos. 5,694,146; 5,912,839; and 6,141,241; the disclosures of which are hereby incorporated by reference. Chalcogenide device arrays may be used for both memory and processing capabilities; including logic and parallel computing.

The foregoing discussion and description are not meant to be limitations upon the practice of the present invention, but rather illustrative thereof. It is to be appreciated by persons of skill in the art that numerous equivalents of the illustrative embodiments disclosed herein exist. It is the following claims, including all equivalents and obvious variations thereof, in combination with the foregoing disclosure which define the scope of the invention.

We claim:

1. A chalcogenide material comprising Ge, Sb, and Te, said chalcogenide material including a crystalline phase portion and an amorphous phase portion, said chalcogenide material having a first state with a first volume fraction of said crystalline phase portion and a second state with a second volume fraction of said crystalline phase portion, said first state being transformable to said second state upon application of electrical energy, wherein the atomic concentration of Ge is between 15% and 18%, the atomic concentration of Sb is between 25% and 49% and the atomic concentration of Te is between 43% and 49%.

2. The chalcogenide material of claim 1, wherein the atomic concentration of Sb is between 28% and 43%.

3. The chalcogenide material of claim 1, wherein the atomic concentration of Sb is between 32% and 35%.

4. The chalcogenide material of claim 1, wherein the atomic concentration of Te is between 43% and 55%.

5. The chalcogenide material of claim 3, wherein the atomic concentration of Te is between 48% and 51%.

6. An electrical device comprising the chalcogenide material of claim 1, a first electrode in electrical communication with said chalcogenide material, and a second electrode in electrical communication with said chalcogenide material.

7. The chalcogenide material of claim 2, wherein the atomic concentration of Sb is between 33% and 41%.

8. The chalcogenide material of claim 1, wherein the resistance of said first state is greater than the resistance of said second state by a factor of at least 3 and the required set pulse time of said first state is greater than the required set pulse time of said second state by a factor of less than 20.

9. The chalcogenide material of claim 8, wherein the required set pulse time of said first state is greater than the required set pulse time of said second state by a factor of less than 5.

10. The chalcogenide material of claim 8, wherein the resistance of said first state is greater than the resistance of said second state by a factor of at least 10.

11. The chalcogenide material of claim 10, wherein the required set pulse time of said first state is greater than the required set pulse time of said second state by a factor of less than 10.

12. The chalcogenide material of claim 10, wherein the required set pulse time of said first state is greater than the required set pulse time of said second state by a factor of less than 5.

13. The chalcogenide material of claim 8, wherein the resistance of said first state is greater than the resistance of the second state by a factor of at least 20.

14. The chalcogenide material of claim 13, wherein the required set pulse time of said first state is greater than the required set pulse time of said second state by a factor of less than 10.

15. The chalcogenide material of claim 13, wherein the required set pulse time of said first state is greater than the required set pulse time of said second state by a factor of less than 5.

* * * * *